United States Patent [19]

Lytle et al.

[11] Patent Number: 5,391,285
[45] Date of Patent: Feb. 21, 1995

[54] ADJUSTABLE PLATING CELL FOR UNIFORM BUMP PLATING OF SEMICONDUCTOR WAFERS

[75] Inventors: William H. Lytle, Chandler; Tien-Yu T. Lee, Scottsdale; Bennett L. Hileman, Tempe, all of Ariz.

[73] Assignee: Motorola, Inc., Schaumburg, Ill.

[21] Appl. No.: 202,210

[22] Filed: Feb. 25, 1994

[51] Int. Cl.[6] .................. C25D 7/12; C25D 17/06; C25D 17/12
[52] U.S. Cl. .................. 205/123; 205/148; 205/266; 204/224 R; 204/238; 204/275; 204/284; 204/292
[58] Field of Search ............ 204/275, 237, 238, 284, 204/292, 224 R, DIG. 7; 205/123, 266, 96, 148

[56] References Cited

U.S. PATENT DOCUMENTS

| | | | |
|---|---|---|---|
| 3,536,594 | 10/1970 | Pritchard | 205/123 |
| 4,304,641 | 12/1981 | Grandia et al. | 204/DIG. 7 X |
| 4,339,319 | 7/1982 | Aigo | 204/224 R |
| 4,340,449 | 7/1982 | Srinivasan et al. | 204/224 R X |
| 4,466,864 | 8/1984 | Bacon et al. | 205/123 X |
| 4,906,341 | 3/1990 | Yamakawa et al. | 205/123 |
| 5,000,827 | 3/1993 | Schuster et al. | 205/118 |
| 5,228,966 | 7/1993 | Murata | 204/275 X |

*Primary Examiner*—Donald R. Valentine
*Attorney, Agent, or Firm*—Robert D. Atkins

[57] ABSTRACT

An apparatus plates metal bumps of uniform height on one surface of a semiconductor wafer (32). A plating tank (12) contains the plating solution. The plating solution is filtered (16) and pumped (14) through an inlet (22) to an anode plate (24) within plating cell (20). The anode plate has a solid center area to block direct in-line passage of the plating solution, and concentric rings of openings closer to its perimeter to pass the plating solution. The distance between the inlet and the anode plate is adjustable with supports to create a uniform flow of the plating solution to the surface of the semiconductor wafer for uniform plating of the array of metal bumps (30). The plating cell contains an adjustable sidewall extension (26) to set the proper distance between the anode plate and the semiconductor wafer.

19 Claims, 1 Drawing Sheet

ADJUSTABLE PLATING CELL FOR UNIFORM BUMP PLATING OF SEMICONDUCTOR WAFERS

BACKGROUND OF THE INVENTION

The present invention relates in general to semiconductor device fabrication and, more particularly, to uniform plating of metal bumps on the surface of a semiconductor wafer.

With recent advances in semiconductor fabrication technology, transistors in the submicron range have allowed a very large number of transistors to be formed on one semiconductor device. With the large number of transistors and corresponding circuit nodes, the semiconductor device often requires a large number of electrical contacts to pass electrical signals to and from the device.

The electrical contacts are commonly formed by using pin grid arrays (PGA), or ball grid arrays (BGA). The array of contacts may be formed by plating an array of metal bumps on the semiconductor device while still in wafer form. Ideally, the plating process to form the metals bumps should produce metal bumps of uniform height and flat-end surface in order to make good bonding to a device package, such as flip-chip or tape automated bonding (TAB). The plating process should avoid over-plating and flow effects which can cause shorts between the metal bumps.

In the prior art, for example as described in U.S. Pat. No. 5,000,827, the plating process may occur in a plating container having an open top and an inlet at the bottom. The semiconductor wafer is suspended over the top of the plating container. Predetermined sites of the semiconductor wafer where the metal bumps are to be formed are patterned by a photolithography process to mask all areas but the plating sites. A round metal anode plate with an array of openings evenly spaced about its entire surface, or in the form of a mesh, is placed typically at the bottom of the plating container over the plating solution inlet. A voltage source is applied between the metal anode plate and the semiconductor wafer. The plating solution circulates through the inlet and anode plate throughout the container whereby the plating solution is deposited at the predetermined sites on the semiconductor wafer by an electroplating process.

A uniform flow is important during the electroplating process to provide even deposition of the metal ions from the plating solution onto the plating sites. Unfortunately, the prior art arrangement does not consistently result in the desired uniform height of the metal bumps in part because of the non-uniform flow of plating solution in and around the semiconductor wafer. The placement of openings in the anode plate and its position at the bottom of the plating container cause a turbulence in the plating container resulting in the uneven flow of plating solution.

As the plating solution enters the plating container, it flows directly through the mesh network of the anode. The plating solution flow rate is greater nearer to the center of the inner cavity than it is around the walls of the container. That is, the plating solution flows straight up through the center of the container, strikes the semiconductor wafer, flows laterally toward the walls, and then circulates back down the walls toward the bottom of the contain causing the turbulent flow. The flow rate near the center of semiconductor wafer is thus greater than in the peripheral region as the plating solution velocity slows down. Thus, the non-uniform flow rate of the plating solution as it flows laterally across the plating sites results in non-uniform height in metal bumps. Furthermore, the prior art plating process has problems with shorts between the closely positioned metals bumps. The manufacturing defects result in rejection of defective semiconductor wafers and subsequent increase in manufacturing cost.

Hence, a need exists for a plating process that produces isolated bumps of uniform height.

DETAILED DESCRIPTION OF THE PREFERRED EMBODIMENT

Figure 1:
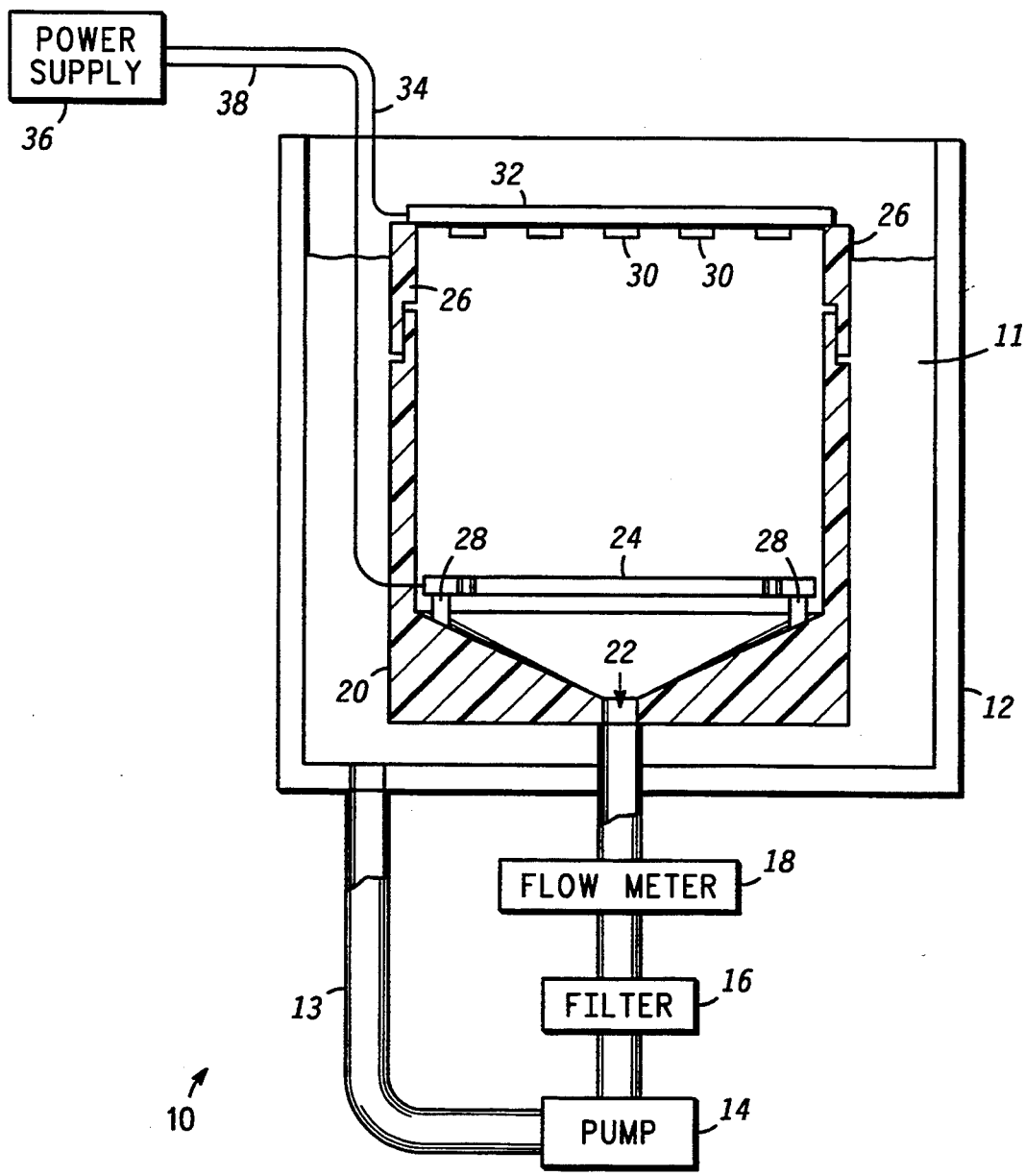
FIG. 1 illustrated an apparatus for plating metal bumps on a semiconductor wafer.

Referring to FIG. 1, a plating apparatus 10 is shown for fabricating metal bumps on a semiconductor wafer or substrate by an electroplating process. An electroplating solution 11 contained in plating tank 12 is drawn through return pipe 13 by pump 14. The plating solution is pumped through filter 16 to remove solid particulate contaminants. Flow meter 18 monitors the flow rate of the plating solution. The plating solution is delivered into the inner cavity of plating cell 20 by way of inlet 22. The plating solution flows through anode plate 24 and circulates in and about plating cell 20 in a uniform manner. The plating solution spills over the top edge of plating cell 20 back into plating tank 12. Plating tank 12 acts as a reservoir for excess plating solution. It is important that the excess plating solution maintain a minimum concentration of ions which are continuously removed during the plating process.

To understand the plating process, plating sites must first be formed in specific locations on semiconductor wafer 32. The plating sites are formed by a photolithography process where a non-conductive photoresistive material is patterned to mask all areas but the plating sites so as to allow only specific areas to be plated. Metal bumps 30 are formed on the plating sites by passing an electrical current through the electroplating solution which is composed of dissolved ions of the material to be plated. Some examples of the plating material is indium, copper, tin, and gold. Conductor 34 of power supply 36 is coupled to semiconductor wafer 32 for providing a first power supply potential to negatively charge the wafer. Conductor 38 of power supply 36 is coupled to anode plate 24 for providing a second power supply potential to positively charge the anode plate. The potential difference between conductors 34 and 38 is approximately 1.2 volts. Power supply 36 causes a current (electrons) to flow taking positively charged metal ions from anode plate 24 to the negatively charged plating sites on semiconductor wafer 32 to by way of electrical conduction through the plating solution. The electrons are transferred to positively charged metal ions at the plating sites by reduction and become neutral. Metal ions in the plating solution are thus reduced to a metallic state and deposited at the plating sites of semiconductor wafer 32 to form metal bumps 32 by a process of electrodeposition, or plating.

In one method, the transfer of electrons from the anode surface is called oxidation. The anode material itself oxidizes and dissolves away as the metal becomes ionic. Anode plate 24 is made of the same material as that to be plated. Portions of anode plate 24 are corroded away by the plating solution to maintain the correct solution concentration. The ionic metal from anode plate 24 conducts away to the plating sites of semiconductor wafer 32 where it is reduced to the metallic state as metal bumps 30. The oxidation method is very practical in that the concentration of metal ions remains substantially constant, so the plating solution requires little maintenance.

In some cases such as plating of precious metals, e.g. gold, where it is too expensive to use a corrodible anode plate. In this case, anode plate 24 is made of a conducting material such as titanium or stainless steel, chosen for its inertness to the plating solution. Again, the positively charged metal ions are attracted to the negatively charged plating sites by way of electrical conduction through the plating solution. The electrons are transferred to positively charged metal ions at the plating sites by reduction and become neutral. The reduced metal atoms are deposited on the plating sites to form metal bumps 30. The metal in the plating solution must be periodically replaced. Solution concentration must be maintained by periodic analysis and specified additions of metal ions. The plating solution has a precious metal concentration of say 1.5 troy ounces per gallon.

In an alternate embodiment, conductive polymers may be electroplated to metal bumps 30. The polymers are reduced at anode plate 24. In this case, semiconductor wafer 32 operates as an anode and anode plate 24 functions as the cathode.

The metal ions travel through the solution at a speed relative to the chemical and physical properties of the solution. The attraction of the negatively charged cathode increases the speed of ions near the semiconductor wafer. Eventually there becomes regions in the plating solution near the point of deposition that are depleted of metal ions for deposition. Typically the depletion is renewed by agitation. In the present embodiment, the replenishment is accomplished by forcing the plating solution through the cell towards the semiconductor wafer. Allowing the plating solution to flow through anode plate 24 improves the efficiency by keeping the ions in a more coherent path. The amount of metal to be deposited can be very closely approximated by use of Faraday's law which relates the weight of the metal to deposited to the amount of current supplied and the duration of time in which the current is on. Exact thicknesses are determined from the metal density and optimized experimentally.

The placement of metal atoms during plating is also effected by the flow path of the solution. The deposition has a tendency to follow the path the solution takes as it moves across semiconductor wafer 32, detrimentally effecting the shape of the bumps as they grow. Computer modeling is employed to determine the positions of the various parts of plating cell 20 which give an optimum plating solution flow path. It was determined that anode plate 24 may be raised a certain distance, say 0.5 inches above inlet 22 in plating cell 20 to create a regulation zone between inlet 22 and anode plate 24 that regulates the dispersion and spread of the path of the solution and thus creates a more even solution velocity through plating cell 20 towards semiconductor wafer 32.

A part of the present invention, anode plate 24 rests on anode supports 28 to position anode plate 24 a predetermined distance from inlet 22. The plating solution passes through openings in anode plate 24 creating a flow regulation or dispersion zone between inlet 22 and anode plate 24. The proper placement of anode plate 24 by way of anode supports 28 achieves a uniform flow of the plating solution about the plating sites of semiconductor wafer 32 where metal bumps 30 are formed. The uniform flow of plating solution during the electroplating process creates substantially uniform height in metal bumps 30 while minimizing electrical shorts between the metal bumps. The metals bumps should be of uniform height and flat-end surface in order to make good bonding to a device package, such as flip-chip or tape automated bonding.

A variety of plating solutions may be used and typically operate optimally at different flow rates depending on application and chemistry. Because of the possible variations in process, the regulation or dispersion zone within the cavity of plating cell 20 must be adjustable. The distance between inlet 22 and anode plate 24 is determined by computer simulation modeling to optimize the flow path for a given parameters of plating solution, plating cell volume, plating solution velocity, and anode design. Anode plate 24 is placed at a variety of positions for a given set of parameters. The computer simulation monitors flow rate and adjusts the distance between inlet 22 and anode plate 24 until an optimally uniform flow of the plating solution within plating cell 20 is achieved. For example, for a cylindrical plating cell having a volume of 570 milliliters with a plating solution containing indium and with a pump speed of four liter/minute, the proper distance between inlet 22 and anode plate 24 has been determined to be 0.5 inches.

The adjustment is accomplished by changing the height of the regulation/dispersion zone, that is the space between inlet 22 and anode plate 24 using anode supports 28 of specific heights. Anode supports 28 may be a ring that fits inside plating cell 20 having a diameter slightly less than the diameter of plating cell 20 to allow ease of insertion or removal. The fit must be sufficiently snug so as to remain in place and provide support for anode plate 24. Anode supports 28 are made of compressible and chemically resistant material such as polypropylene plastic or teflon. The anode support ring can be either of the exact height required, or several thinner ones can be stacked together to achieve the desired height and thereby optimize the flow regulation.

As the height of anode plate 24 within plating cell 20 increases, the distance between anode plate 24 and semiconductor wafer 32 decreases. To provide sufficient distance between anode plate 24 and semiconductor wafer 32, plating cell extension 26 is added onto the sidewalls of plating cell 20. The height of plating cell extension 26 is selected to optimize the uniform flow of the plating solution. For example, a certain volume of plating solution is required in the plating cell to alleviate depletion of metal ions. Since the diameter of the semiconductor wafer dictates the diameter of the plating cell, volume can only be increased by increasing the length of the cell. Alternately, the cell length must be increased to change the flow pattern. Therefore, if the anode height is raised to increase the regulation zone, the plating cell itself must be extended.

In general, the distance between anode plate 24 and semiconductor wafer 32 is determined by computer modeling to optimize the flow path for a given plating solution. For example, the distances between the anode plate and the semiconductor wafer in fountain-style platers is typically selected at 2.5 inches.

It is further important to note that the plating cell with solution is part of the electrical circuit formed by the cathode area, anode area and solution resistance within the plating cell determine the total resistance of the cell. The solution resistance is itself a function of the conductivity of the solution, and the length and diameter of the solution within the cell. The conductivity of the solution is fixed by the requirements of the process chemistry. Every plating process has a specific voltage limit (electrode reduction potential) which must be met in order for plating to occur. If the cell potential is too low, plating will be very inefficient or probably not occur. If the potential is too high, unwanted side reactions may occur which could be detrimental to the process.

By Ohm's Law, it can be seen that in order to maintain a specific plating voltage, at a specified current, resistance is the only condition (parameter) which can be changed. Within the total resistance of the plating cell, the only factor which can be easily changed is the distance from the anode plate to the semiconductor wafer, or cell length by use of plating cell extension 26. Extensions should be of the same material as the anode support and plating cell. They are fabricated so as to stack on top of each other and the main body of the plating cell.

Figure 2:
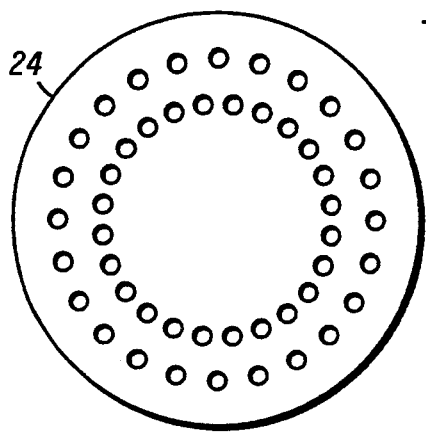
FIG. 2 illustrates the anode plate of FIG. 1.

Turning to FIG. 2, anode plate 24 is shown in further detail. The center of anode plate 24 is solid to block the direct path of plating solution as it flows from inlet 22 into plating cell 20. Anode plate 24 includes concentric rings of openings close to its perimeter to pass the plating solution. One set of openings are placed in locations around anode plate 24 approximately half the distance between the center and its edge, and another set nearer to the perimeter. The openings can cut as round holes, or semi-circular slots, but the center should be solid to provide a barrier over the plating inlet. For a four inch diameter anode plate, the openings are each 0.25 inches in diameter. The spacing between openings of the outer concentric ring is approximately 0.25 inches. The spacing between openings of the inner concentric ring is approximately 0.5 inches.

In contrast to the prior art as described in the background, the present invention blocks the direct flow of plating solution entering plating cell 20 by way of inlet 22. The plating solution is deflected from its center path in line with inlet 22 and forced to flow toward the perimeter of anode plate 24 where it exits through the anode openings into the cavity of the plating cell. The plating solution then flows up toward semiconductor wafer 32 with a uniform flow rate in all region of the plating cell. When the plating solution reaches the semiconductor wafer, it has a uniform flow rate at each plating site. The electroplating thus creates metal bumps of uniform height while minimizing electrical shorts. The combination of blocking direct flow of the plating solution with proper placement of the anode plate from the inlet achieves the desired uniform flow of plating solution in and about the plating sites of the semiconductor wafer.

The present invention is especially useful in plating metals such as indium as the metal bumps on the semiconductor wafer 32. Indium is a metal known for difficulty in obtaining uniform bumps, prior to this method plated indium bumps tended to be much thicker on the sides corresponding the direction of flow, creating non-uniform processing and electrical shorts. In another embodiment, a combination of conductive inert anode material with an inert device in the shape described in FIG. 2 could also be used in certain applications such as precious metals. In conjunction with the anode height of the regulation zone, the position of the openings in the anode plate also effect on the solution flow path.

By now it should be appreciated that the present invention provides for the fabrication of electrically conducting bumps used in manufacture of semiconductor devices. The apparatus is used to control and ensure uniform shape and height of electroplated bumps plated across the semiconductor wafer or substrate. The anode plate is selected with one set of openings half way between its center and perimeter and another set nearer to the perimeter. The center of the anode plate is solid center to block direct flow of the plating solution from the inlet into the plating cell. By properly adjusting the relative positions between the solution inlet plane, the anode plate, and semiconductor wafer, depending on the plating material selected, uniform metal bumps can be formed on the plating sites of the semiconductor wafer.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. An apparatus for plating a surface of a semiconductor wafer, comprising:
   a plating cell having an inlet for receiving a plating solution;
   an anode plate having an interior area that is solid for blocking passage of said plating solution and having a plurality of openings around its perimeter for passing said plating solution; and
   a support for supporting said anode plate within said plating cell at a predetermined position so as to create a uniform flow of said plating solution at the surface of the semiconductor wafer.

2. The apparatus of claim 1 further including a power supply having a first conductor coupled to said anode plate and having a second conductor coupled to the semiconductor wafer.

3. The apparatus of claim 2 wherein said anode plate includes a first plurality of openings around a perimeter area for passing said plating solution.

4. The apparatus of claim 3 wherein said anode plate includes a solid center area for blocking said plating solution.

5. The apparatus of claim 4 wherein said anode plate includes a second plurality of openings substantially halfway between said center area and said perimeter area for passing said plating solution.

6. The apparatus of claim 5 further including an extension to sidewalls of said plating cell.

7. The apparatus of claim 6 wherein said plating solution includes indium or gold.

8. The apparatus of claim 6 wherein said anode plate is made of indium.

9. A method of plating a surface of a semiconductor wafer, comprising the steps of:
   receiving a plating solution at an inlet to a cavity of a plating cell;
   blocking passage of said plating solution into said cavity of said plating cell with an anode plate having a solid center region; and passing said plating solution through outer region of said anode plate into said cavity of said plating cell to create an even flow of said plating solution at the surface of the semiconductor wafer.

10. The method of claim 9 further including the step of applying a first power supply potential to said anode plate and a second power supply potential to the semiconductor wafer.

11. The method of claim 10 further including the step of extending sidewalls of said plating cell.

12. The method of claim 11 wherein said anode plate includes a first plurality of openings around a perimeter area for passing said plating solution.

13. The method of claim 12 wherein said anode includes a second plurality of openings substantially halfway between said solid center region and said perimeter area for passing said plating solution.

14. The method of claim 13 wherein said plating solution includes indium or gold.

15. The method of claim 13 wherein said anode plate is made of indium.

16. An apparatus for plating a surface of a semiconductor wafer, comprising:

a plating cell having an inlet for receiving a plating solution;

an anode plate having an interior area substantial solid for blocking passage of said plating solution and having a plurality of openings around its perimeter for passing said plating solution;

first means for supporting said anode plate within said plating cell at a predetermined position so as to create an even flow of said plating solution at the surface of the semiconductor wafer; and second means for extending sidewalls of said plating cell to adjust distance between said anode plate supported at said predetermined position and the semiconductor wafer.

17. The apparatus of claim 16 further including a power supply having a first conductor coupled to said anode plate and having a second conductor coupled to the semiconductor wafer.

18. The apparatus of claim 17 wherein said anode plate includes openings substantially halfway between said center area and said perimeter area for passing said plating solution.

19. The apparatus of claim 18 wherein said plating solution includes indium or gold.

* * * * *